(12) United States Patent
Ting et al.

(10) Patent No.: US 11,616,094 B2
(45) Date of Patent: Mar. 28, 2023

(54) MICRO LIGHT-EMITTING COMPONENT, MICRO LIGHT-EMITTING COMPONENT MATRIX, AND METHOD FOR MANUFACTURING THE MICRO LIGHT-EMITTING COMPONENT MATRIX

(71) Applicant: XIAMEN SAN'AN OPTOELECTRONICS CO., LTD., Xiamen (CN)

(72) Inventors: Shao-Ying Ting, Xiamen (CN); Junfeng Fan, Xiamen (CN); Chia-En Lee, Xiamen (CN); Chen-Ke Hsu, Xiamen (CN)

(73) Assignee: XIAMEN SAN'AN OPTOELECTRONICS CO., LTD, Xiamen (CN)

( * ) Notice: Subject to any disclaimer, the term of this patent is extended or adjusted under 35 U.S.C. 154(b) by 0 days.

(21) Appl. No.: 16/906,701

(22) Filed: Jun. 19, 2020

(65) Prior Publication Data

US 2020/0321392 A1    Oct. 8, 2020

Related U.S. Application Data

(63) Continuation-in-part of application No. PCT/CN2018/085131, filed on Apr. 28, 2018.

(30) Foreign Application Priority Data

Dec. 21, 2017  (CN) .......................... 201711393774.5

(51) Int. Cl.
*H01L 27/15* (2006.01)
*H01L 33/00* (2010.01)
*H01L 33/46* (2010.01)

(52) U.S. Cl.
CPC ........ *H01L 27/156* (2013.01); *H01L 33/0093* (2020.05); *H01L 33/46* (2013.01)

(58) Field of Classification Search
None
See application file for complete search history.

(56) References Cited

U.S. PATENT DOCUMENTS

| 8,409,886 | B2 * | 4/2013 | Iwafuchi | H01L 27/156 |
| | | | | 438/28 |
| 10,672,805 | B2 * | 6/2020 | Lee | H01L 25/0753 |
| 2016/0104841 | A1 * | 4/2016 | Ahn | H01L 45/1641 |
| | | | | 438/382 |

FOREIGN PATENT DOCUMENTS

CN        104008991 A     8/2014

OTHER PUBLICATIONS

International Search Report for PCT/CN2018/085131 dated Sep. 27, 2018.

* cited by examiner

*Primary Examiner* — Robert K Carpenter
(74) *Attorney, Agent, or Firm* — Thomas | Horstemeyer, LLP.

(57) ABSTRACT

Disclosed is a micro light-emitting component, a micro light-emitting diode, and a transfer layer. The transfer layer has a recess for receiving the micro light-emitting diode to permit the micro light-emitting diode to be retained by the transfer layer, and is transformable from a first state, in which the transfer layer is deformed by the micro light-emitting diode to form the recess, to a second state, in which the micro light-emitting diode received in the recess is retained by the transfer layer. Also disclosed are micro light-emitting component matrix and a method for manufacturing the micro light-emitting component matrix.

29 Claims, 7 Drawing Sheets

MICRO LIGHT-EMITTING COMPONENT, MICRO LIGHT-EMITTING COMPONENT MATRIX, AND METHOD FOR MANUFACTURING THE MICRO LIGHT-EMITTING COMPONENT MATRIX

CROSS-REFERENCE TO RELATED APPLICATION

This application is a bypass continuation-in-part application of International Application No. PCT/CN2018/085131 filed on Apr. 28, 2018, which claims priority of Chinese Patent Application No. 201711393774.5 filed on Dec. 21, 2017. The entire content of each of the international and Chinese patent applications is incorporated herein by reference.

FIELD

The disclosure relates to a micro light-emitting component and a micro light-emitting component matrix, and more particularly to a micro light-emitting component and a micro light-emitting component matrix to be transferred. The disclosure also relates to a method for manufacturing the micro light-emitting component matrix.

BACKGROUND

In a construction of a micro light-emitting diode (micro-LED) matrix for a RGB LED display, the micro-LED matrix is transferred by adhesion (for example, Van der Walls force, magnetic force, or the like) of a transfer material in a solid or semi-solid state. The adhesion, such as Van der Walls force and magnetic force for transferring the micro-LED matrix is usually insufficient, such that a transfer yield for the micro-LED matrix is relatively low.

In addition, since the gaps among the micro-LEDs are very small, the light-emitting areas of adjacent ones of the micro-LEDS may at least partially overlap one another due to scattering angles of the adjacent ones of the micro-LEDs, causing cross-talk interference. Specifically, different light colors from the micro-LEDs interfere with one another, resulting in color error and color unevenness.

Chinese Patent Publication No. CN1378291A discloses a light-emitting diode array with an optical isolation structure. However, the optical isolation structure is not applicable in micro-LEDs.

SUMMARY

An object of the disclosure is to provide a solution to address the drawback of the prior art.

According to a first aspect of the disclosure, there is provided a micro light-emitting component which includes a micro light-emitting diode and a transfer layer. The transfer layer has a recess for receiving the micro light-emitting diode so as to permit the micro light-emitting diode to be retained by the transfer layer, and is transformable from a first state, in which the transfer layer is deformed by the micro light-emitting diode to form the recess, to a second state, in which the micro light-emitting diode received in the recess is retained by the transfer layer.

According to a second aspect of the disclosure, there is provided a micro light-emitting component matrix which includes a plurality of micro light-emitting diodes and a transfer layer. The transfer layer has a plurality of recesses for receiving the micro light-emitting diodes, respectively, so as to permit the micro light-emitting diodes to be retained by the transfer layer, and is transformable from a first state, in which the transfer layer is deformed by the micro light-emitting diodes to form the recesses, to a second state, in which the micro light-emitting diodes respectively received in the recesses are retained by the transfer layer.

According to a third aspect of the disclosure, there is provided a method for manufacturing a micro light-emitting component matrix, which includes the steps of:

a) forming a sacrificial layer on a support member;

b) forming a transfer layer on the sacrificial layer, the transfer layer being transformable from a first state, in which the transfer layer is deformable, to a second state, in which the transfer layer is deformed to produce a retaining force; and c) subjecting the transfer layer to deformation by a plurality of micro light-emitting diodes at the first state such that a plurality of recesses, each of which has a depth ranging from 0.1 µm to 5.0 µm, are formed in the transfer layer to receive the micro light-emitting diodes therein, respectively, so as to permit the micro light-emitting diodes respectively received in the recesses to be retained by the transfer layer at the second state.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
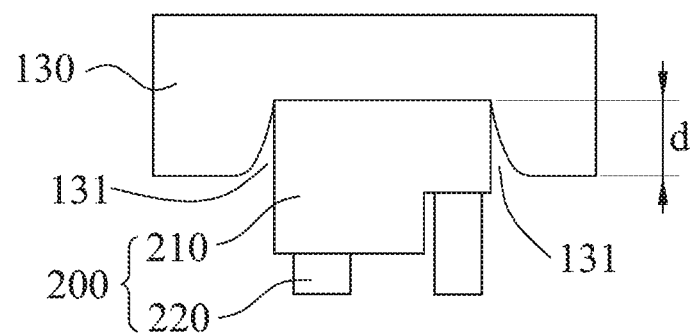
FIG. 1 is a schematic side view of a first embodiment of a micro light-emitting component according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a micro light-emitting component according to the disclosure includes a micro light-emitting diode 200 and a transfer layer 130.

The micro light-emitting diode 200 may be, for example, a face-up type light-emitting diode, a flip type light-emitting diode, or a vertical type light-emitting diode. The micro light-emitting diode 200 includes an epitaxial structure 210 and a pair of electrodes 220.

The transfer layer 130 has a recess 131 for receiving the micro light-emitting diode 200 so as to permit the micro light-emitting diode 200 to be retained by the transfer layer 130, and covers the top and/or the side of the micro light-emitting diode 200. The recess 131 forms an opening that converges inwardly. The transfer layer 130 is transformable from a first state, in which the transfer layer 130 is deformed by the micro light-emitting diode 200 to form the recess 131, to a second state, in which the micro light-emitting diode 200 received in the recess 131 is retained by the transfer layer 130.

The transfer layer 130 deformed by the micro light-emitting diode 200 produces a retaining force to permit the micro light-emitting diode 200 to be retained by the transfer layer 130. The recess 131 is formed at a substantially central position of the transfer layer 130, such that the retaining force may be evenly applied on the micro light-emitting diode 200.

In certain embodiments, the recess 131 may have a depth (d) ranging from 0.1 µm to 5.0 µm. In certain embodiments, the recess 131 may have a depth ranging from 0.5 µm to 1.5 µm.

In certain embodiments, the transfer layer 130 may be made of a material selected from the group consisting of a benzocyclobutene adhesive, a silicone, an epoxy resin, an ultraviolet curing adhesive, and combinations thereof.

Figure 2:
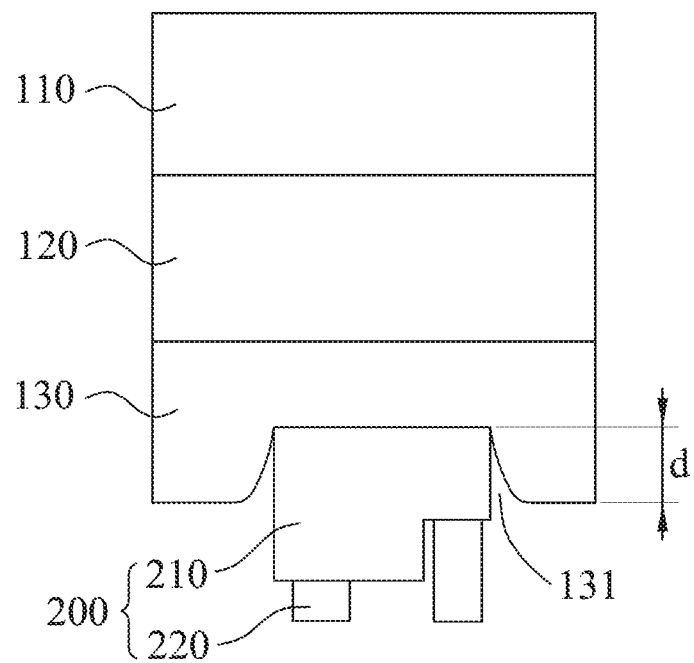
FIG. 2 is a schematic side view of a second embodiment of the micro light-emitting component according to the disclosure.

Referring to FIG. 2, a second embodiment of the micro light-emitting component according to the disclosure is similar to the first embodiment except that the second embodiment further includes a sacrificial layer 120 and a support member 110.

The sacrificial layer 120 is disposed on the transfer layer 130 opposite to the micro light-emitting diode 200. The support member 110 is disposed on the sacrificial layer 120 opposite to the transfer layer 130, and may be a light-transmissive support or an opaque support. Since the transfer layer 130 has a relatively small thickness, the sacrificial layer 120 and the support member 110 are provided in a manner that the sacrificial layer 120 is sandwiched between the transfer layer 130 and the support member 110, such that the transfer layer 130 can be supported by the support member 110 sufficiently via the sacrificial layer 120 so as to successfully implement the subsequent transferring procedure of the micro light-emitting diode 200.

In certain embodiments, the sacrificial layer 120 may be made of a material selected from the group consisting of GaN, AlGaN, InGaN, GaSiN, GaMgN, and combinations thereof. In practice, the sacrificial layer 120 is desirably made of a material which is transparent and which can be removed or decomposed easily.

Figure 3:
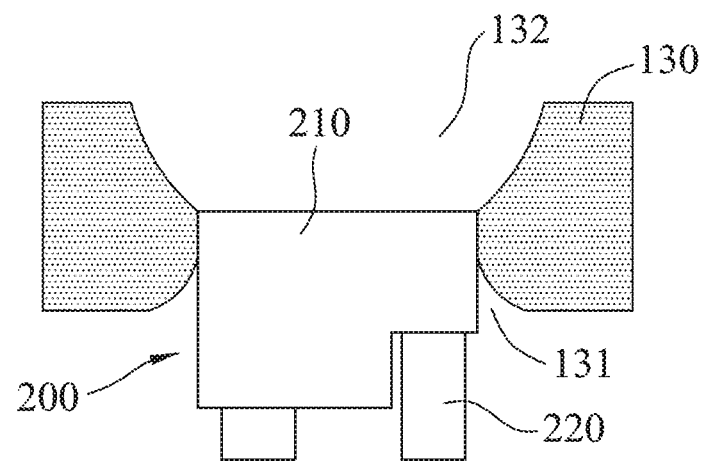
FIG. 3 is a schematic side view of a third embodiment of the micro light-emitting component according to the disclosure.

Referring to FIG. 3, a third embodiment of the micro light-emitting component according to the disclosure is similar to the first embodiment except for the following differences.

In the third embodiment, the transfer layer 130 is made of an opaque material, which can be a light-reflective material, a light-absorptive material, or a combination thereof. In addition, the transfer layer 130 further has a top opening 132 which is disposed opposite to the recess 131, and which is configured to permit light from the micro light-emitting diode 200 to transmit therethrough.

Figure 4:
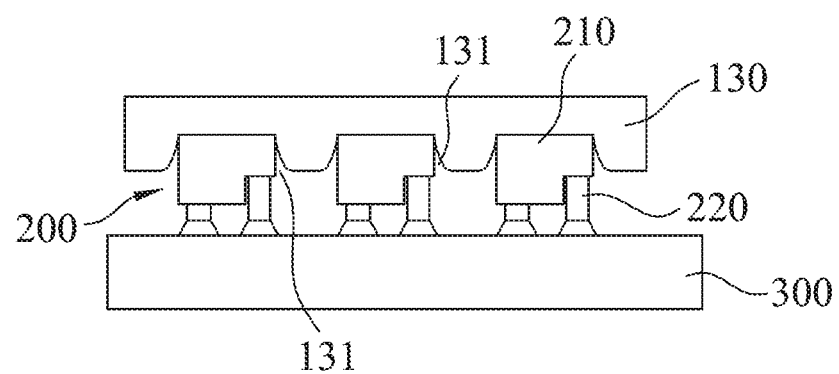
FIG. 4 is a schematic side view of a first embodiment of a micro light-emitting component matrix according to the disclosure.

Referring to FIG. 4, a first embodiment of a micro light-emitting component matrix according to the disclosure includes a plurality of micro light-emitting diodes 200 and a transfer layer 130.

The micro light-emitting diodes 200 may be independently, for example, a face-up type light-emitting diode, a flip type light-emitting diode, or a vertical type light-emitting diode. In addition, the micro light-emitting diodes 200 may be independently selected from the group consisting of a red light-emitting diode, a blue light-emitting diode, and a green light-emitting diode so as to satisfy various combinations of light elements. Each of the micro light-emitting diodes 200 includes an epitaxial structure 210 and a pair of electrodes 220.

The transfer layer 130 has a plurality of recesses 131 for receiving the micro light-emitting diodes 200, respectively, so as to permit the micro light-emitting diodes 200 to be retained by the transfer layer 130, and covers the top and/or the side of each of the micro light-emitting diodes 200. The transfer layer 130 is transformable from a first state, in which the transfer layer 130 is deformed by the micro light-emitting diodes 200 to form the recesses 131, to a second state, in which the micro light-emitting diodes 200 respectively received in the recesses 131 are retained by the transfer layer 130.

In addition, a bonding substrate 300 is included opposite to the transfer layer 130 to be bonded to the micro light-emitting diodes 200.

Figure 13:
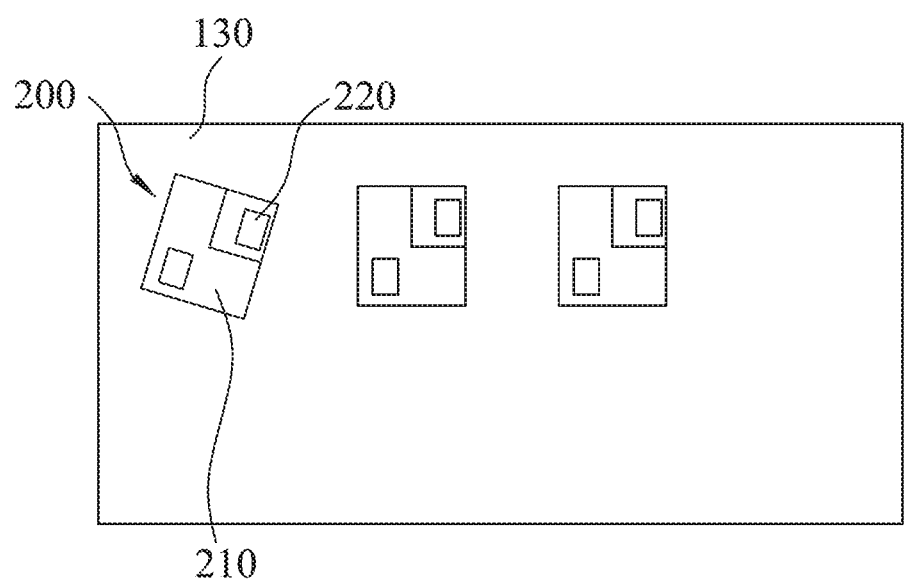
FIG. 13 is a schematic side view illustrating abnormal arrangement of a plurality of micro light-emitting components in a micro light-emitting component matrix due to a transfer layer being over-pressed.

Referring to FIG. 13, when the transfer layer 130 is over-pressed, the depths of the recesses 131 are excessively large such that the micro light-emitting diodes 200 may be rotated undesirably to cause an abnormal arrangement of the micro light-emitting diodes 200. Therefore, each of the recesses 131 desirably has a depth ranging from 0.1 µm to 5.0 µm so as to achieve a superior transfer yield. In certain embodiments, each of the recesses 131 may have a depth ranging from 0.5 µm to 1.5 µm. Each of the recesses 131 forms an opening that converges inwardly.

The transfer layer 130 deformed by the micro light-emitting diodes 200 produces retaining forces to permit the micro light-emitting diodes 200 to be retained by the transfer layer 130. In certain embodiments, the transfer layer 130 may be made of a material selected from the group consisting of a benzocyclobutene adhesive, a silicone, an epoxy resin, an ultraviolet curing adhesive, and combinations thereof.

Figure 12:
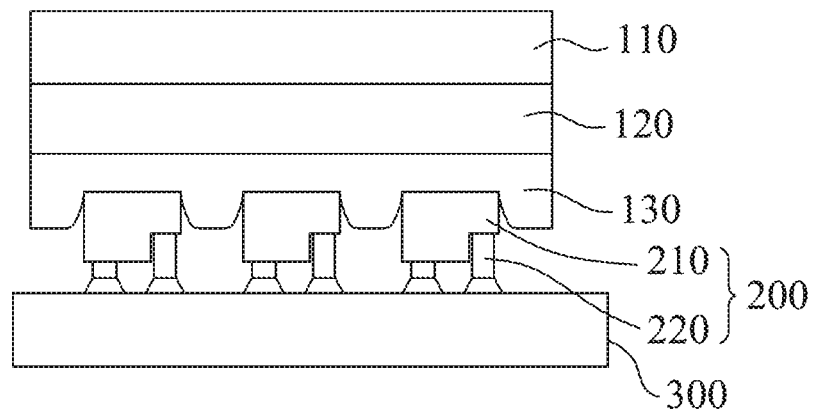

Referring to FIG. 12, in a variation of the first embodiment of the micro light-emitting component matrix according to the disclosure, a sacrificial layer 120 and a support member 110 are further included.

The sacrificial layer 120 is disposed on the transfer layer 130 opposite to the micro light-emitting diodes 200, and is made of a light-transmissive material. In certain embodiments, the sacrificial layer 120 may be made of a material selected from the group consisting of GaN, AlGaN, InGaN, GaSiN, GaMgN, and combinations thereof.

The support member 110 is disposed on the sacrificial layer 120 opposite to the transfer layer 130, and may be a light-transmissive support or an opaque support.

Figure 5:
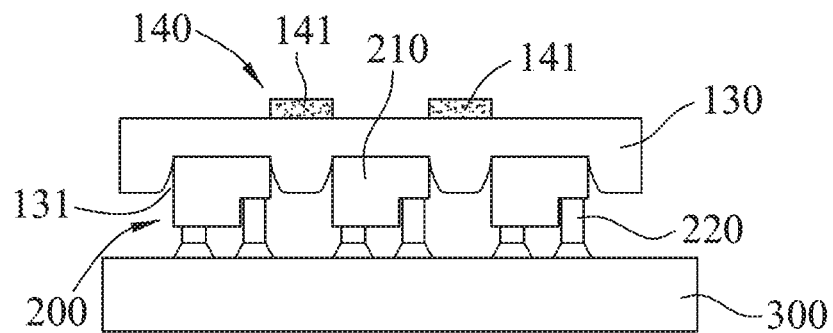
FIG. 5 is a schematic side view of a second embodiment of the micro light-emitting component matrix according to the disclosure.

Referring to FIG. 5, a second embodiment of the micro light-emitting component matrix according to the disclosure is similar to the first embodiment except that a light-blocking layer 140 is further included in the second embodiment.

The light-blocking layer 140 includes a plurality of light-blocking portions 141 which are disposed on the transfer layer 130 opposite to the micro light-emitting diodes 200, and each of which is aligned with a gap between two adjacent ones of the micro light-emitting diodes 200.

In certain embodiments, the light-blocking layer 140 may be made of a light-reflective material, a light-absorptive material, or a combination thereof. In certain embodiments, the light-blocking layer 140 may be made of a metal material, a non-metal material, or a combination thereof.

Figure 6:
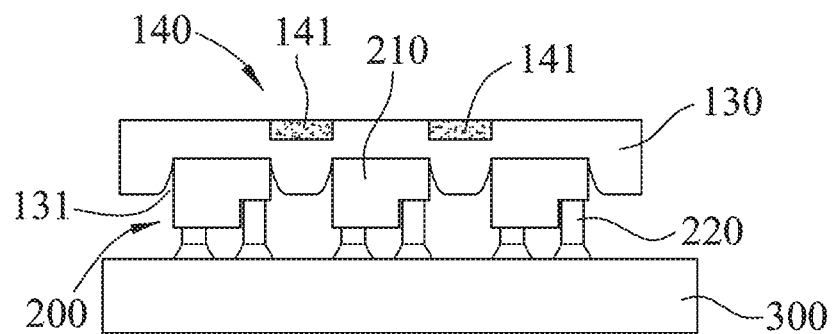
FIG. 6 is a schematic side view of a third embodiment of the micro light-emitting component matrix according to the disclosure.

Referring to FIG. 6, a third embodiment of the micro light-emitting component matrix according to the disclosure is similar to the second embodiment except that the light-blocking portions 141 are inserted in the transfer layer 130.

Figure 7:
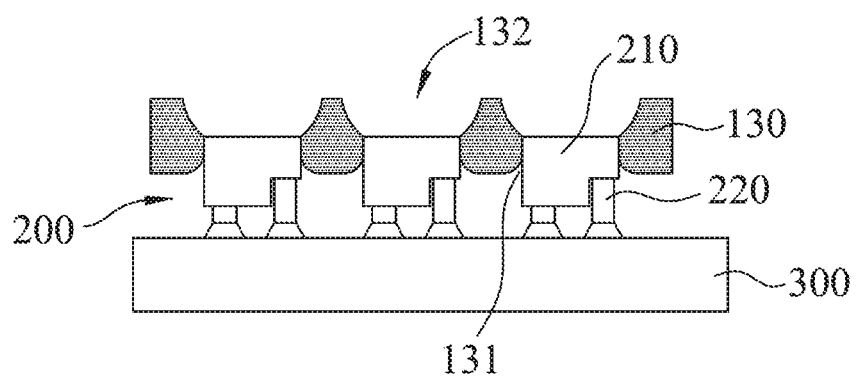
FIG. 7 is a schematic side view of a fourth embodiment of the micro light-emitting component matrix according to the disclosure.
Figure 8:
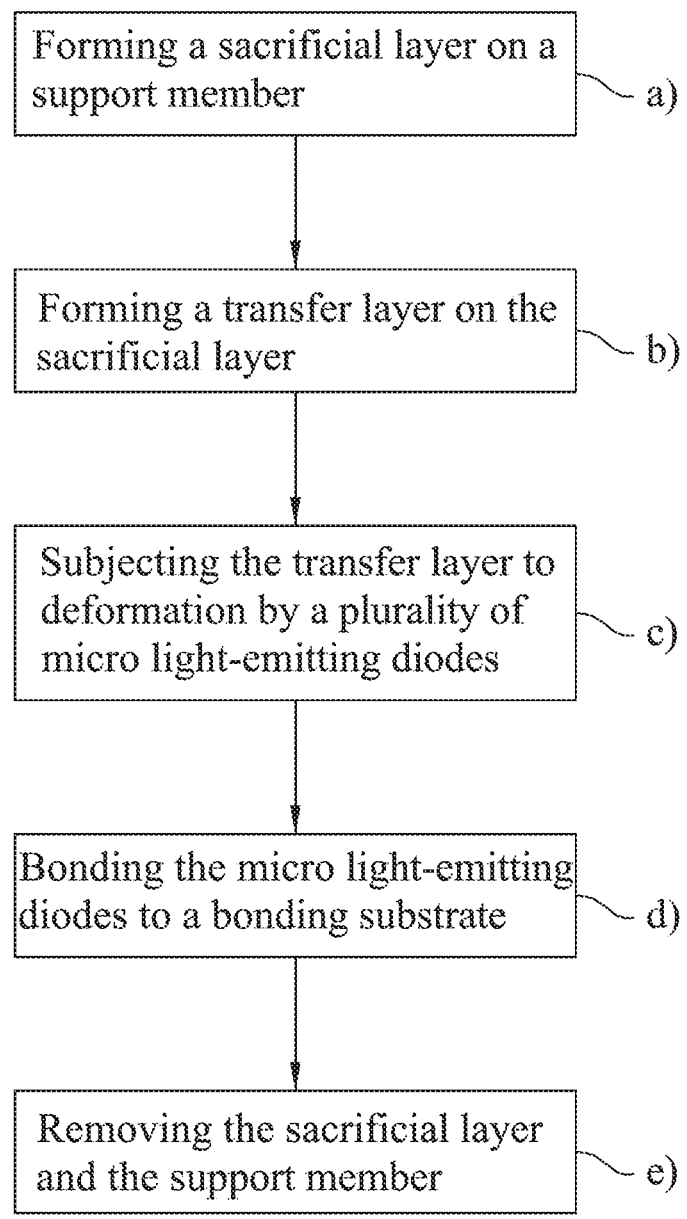
FIG. 8 is a flow diagram of an embodiment of a method for manufacturing a micro light-emitting component matrix according to the disclosure.
Figure 9:
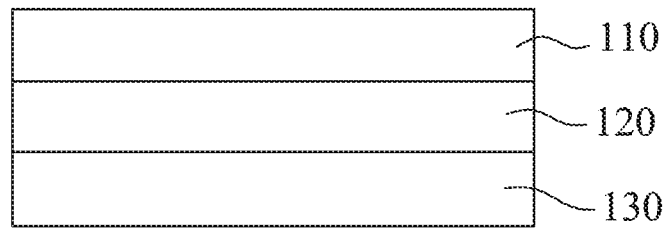
FIGS. 9 to 12 are schematic side views illustrating consecutive steps of the embodiment of FIG. 8.
Figure 10:
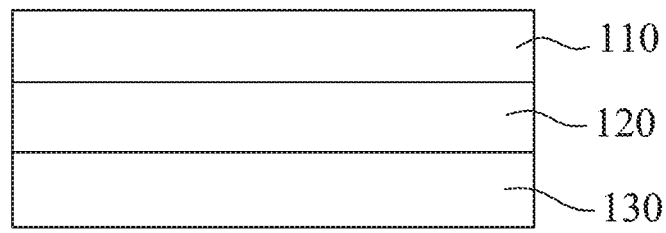
Figure 10:
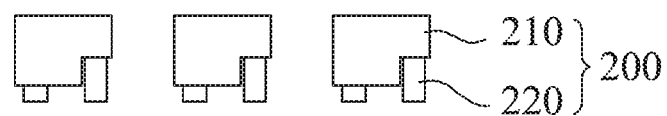
Figure 11:
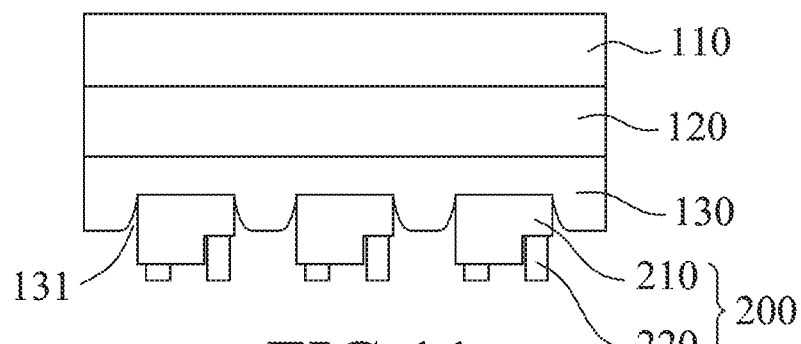

Referring to FIG. 7, a fourth embodiment of the micro light-emitting component matrix according to the disclosure is similar to the first embodiment except for the following differences.

In the fourth embodiment, the transfer layer 130 is made of an opaque material selected from the group consisting of a light-reflective material, a light-absorptive material, and a combination thereof, and further has a plurality of top openings 132. Each of the top openings 132 is disposed opposite to a corresponding one of the recesses 131, and is configured to permit light from a corresponding one of the micro light-emitting diodes 200 to transmit therethrough. The top openings 132 may be used for permitting the lights emitted from the micro light-emitting diodes 200 to pass therethrough, or for electrically connecting the micro light-emitting diode 200 to a circuit (not shown).

The micro light-emitting component matrix according to the disclosure may be applied in, for example, an LED display, an LED television, or the like.

Referring to FIGS. 8 to 12, a first embodiment of a method for manufacturing a micro light-emitting component matrix according to the disclosure includes the steps of:

a) forming a sacrificial layer 120 on a support member 110;

b) forming a transfer layer 130 on the sacrificial layer 120;

c) subjecting the transfer layer 130 to deformation by a plurality of micro light-emitting diodes 200; d) bonding the micro light-emitting diodes 200 to a bonding substrate 300; and e) removing the sacrificial layer 120 and the support member 110.

In step a), the sacrificial layer 120 is formed on the support member 110. The support member 110 can be a light-transmissive support or an opaque support. The light-transmissive support (for example, sapphire) should be chosen as the support member 110 as far as the alignment operation is concerned. Alternatively, the opaque support (for example, an opaque metal material) should be chosen as the support member 110 as far as the circuit performance is concerned.

A layer of a gallium nitride-based inorganic material (for example, GaN, AlGaN, InGaN, GaSiN, GaMgN, or combinations thereof) is deposited on the support member 110 via a metal organic vapor phase deposition procedure to form the sacrificial layer 120 on the support member 110. Since the gallium nitride-based organic material has a good light transmission and a superior denseness which can be conferred on the sacrificial layer 120 via the metal organic vapor phase deposition process, the alignment operation of the micro light-emitting components 200 can be implemented easily in the subsequent transferring procedure. Alternatively, the sacrificial layer 120 may be made of an optically decomposable material or a chemically decomposable material.

In step b), the transfer layer 130 is formed on the sacrificial layer 120. The transfer layer 130 is transformable from a first state, in which the transfer layer 130 is deformable, to a second state, in which the transfer layer 130 is deformed to produce a retaining force. The transfer layer 130 may be made of a material selected from the group consisting of a benzocyclobutene adhesive, a silicone, an epoxy resin, an ultraviolet curing adhesive, and combinations thereof.

In step c), the transfer layer 130 is subjected to deformation by the micro light-emitting diodes 200 at the first state such that a plurality of recesses 131, each of which has a depth ranging from 0.1 μm to 5.0 μm, are formed in the transfer layer 130 to receive the micro light-emitting diodes 200 therein, respectively, so as to permit the micro light-emitting diodes 200 respectively received in the recesses 131 to be retained by the transfer layer 130 at the second state.

In certain embodiments, the depth of each of the recesses 131 may range from 0.5 μm to 1.5 μm.

When the transfer layer 130 is made of ultraviolet curing adhesive, the first state (i.e., a deformable state) thereof can be achieved without additionally heating the ultraviolet curing adhesive due to the ultraviolet curing adhesive being deformable at ambient conditions. Therefore, the transfer layer 130 made of the ultraviolet curing adhesive may be deformed by the micro light-emitting diodes 200 at ambient conditions to form the recesses 131, such that the transfer layer 130 deformed by the micro light-emitting diodes 200 can produce retaining forces to permit the micro light-emitting diodes 200 respectively received in the recesses 131 to be retained by the transfer layer 130 at the second state, so as to implement the subsequent transferring procedure of the micro light-emitting diodes 200.

Alternatively, when the transfer layer 130 is made of benzocyclobutene adhesive, the first state (i.e., a deformable state) thereof is achieved by heating the benzocyclobutene adhesive, for example, at a temperature ranging from 180° C. to 250° C. for a time period ranging from 0.5 hour to 2 hours, due to the benzocyclobutene adhesive being not deformable at ambient conditions. The benzocyclobutene adhesive, when heated at a too low temperature and/or for a too short time period, cannot become deformable. Additionally, when benzocyclobutene adhesive is heated at a too high temperature and/or for a too long time period, the retaining forces produced in the transfer layer 130 may be insufficient for permitting the micro light-emitting diodes 200 to be retained by the transfer layer 130.

When the transfer layer 130 is made of benzocyclobutene adhesive, the thus produced retaining forces range from 0.01 kg/mm$^2$ to 0.5 kg/mm.

Since the benzocyclobutene adhesive has superior thermal resistance compared to that of the silicone, the benzocyclobutene adhesive is a better material for making the transfer layer 130 compared to the silicone. Specifically, when the transfer layer 130 made of silicone and the micro light-emitting diodes 200 are bonded to the bonding substrate 300 via an eutectic bonding treatment at a high temperature, an abnormal arrangement of the micro light-emitting diodes 200, as shown in FIG. 13, may occur.

In step d), the micro light-emitting diodes 200 retained by the transfer layer 130 is transferred to be bonded to a bonding substrate 300.

In step e), the sacrificial layer 120 and the support member 110 are removed via chemical decomposition and/or physical separation. For example, when the sacrificial layer 120 is made of gallium nitride, the sacrificial layer 120 may be removed by laser so as to strip the support member 110. In addition, a patterned support member may be used as the support member 110 so as to allow easy stripping of the sacrificial layer 120.

When the micro light-emitting component matrix of the disclosure is applied in LED display, the micro light-emitting diodes 200 may be a combination of various micro light-emitting diodes emitting various lights with different wavelengths. For example, the micro light-emitting diodes 200 may be independently selected from the group consisting of a red light-emitting diode, a blue light-emitting diode, and a green light-emitting diode.

In order to solve the problem of cross-talk interference, the first embodiment of the method for manufacturing a micro light-emitting component matrix according to the disclosure further includes, between steps b) and c), a step of forming a light-blocking layer 140 at the transfer layer 130. The light-blocking layer 140 includes a plurality of light-blocking portions 141, each of which is aligned with a gap between two adjacent ones of the micro light-emitting diodes 200. The light-blocking portions 141 may be disposed on or inserted in the transfer layer 130. The light-blocking layer 140 may be made of a light-reflective material, a light-absorptive material, or a combination thereof. For example, the light-blocking layer 140 may be made of chromium.

A second embodiment of the method for manufacturing a micro light-emitting component matrix according to the disclosure is similar to the first embodiment except for the following differences.

The transfer layer 130 used in the second embodiment is made of an opaque material, which may be a light-reflective material, a light-absorptive material, or a combination thereof. For example, benzocyclobutene adhesive blended with titanium oxide ($TiO_2$) therein may be used for making the transfer layer 130. When the transfer layer 130 is made of opaque material, the micro light-emitting component matrix thus manufactured can have an improved light emitting effect.

An additional step of forming a plurality of top openings 132 is implemented after step d). The top openings 132 are formed opposite to the recesses 131, respectively, to permit light emitted from the micro light-emitting diode 200 to transmit therethrough, or to electrically connect the micro light-emitting diode 200 to a circuit (not shown).

It should be noted that in the second embodiment, the step of forming the light-blocking layer 140 of the first embodiment is omitted.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A micro light-emitting component, comprising:
   a micro light-emitting diode; and
   a transfer layer which has a recess for receiving said micro light-emitting diode so as to permit said micro light-emitting diode to be retained by said transfer layer, and which is transformable from a first state, in which said transfer layer is deformed by said micro light-emitting diode to form said recess, to a second state, in which said micro light-emitting diode received in said recess is retained by said transfer layer,
   wherein said transfer layer is made of an opaque material which is selected from the group consisting of a light-reflective material, a light-absorptive material, and a combination thereof, and
   wherein said transfer layer further has a top opening which is disposed opposite to said recess, and which is configured to permit light from said micro light-emitting diode to transmit therethrough.

2. The micro light-emitting component according to claim 1, wherein said transfer layer deformed by said micro light-emitting diode produces a retaining force to permit said micro light-emitting diode to be retained by said transfer layer.

3. The micro light-emitting component according to claim 1, wherein said transfer layer is made of a material selected from the group consisting of a benzocyclobutene adhesive, a silicone, an epoxy resin, an ultraviolet curing adhesive, and combinations thereof.

4. The micro light-emitting component according to claim 1, wherein said recess forms an opening that converges inwardly.

5. The micro light-emitting component according to claim 1, wherein said recess has a depth ranging from 0.1 µm to 5.0 µm.

6. The micro light-emitting component according to claim 1, wherein said recess has a depth ranging from 0.5 µm to 1.5 µm.

7. The micro light-emitting component according to claim 1, further comprising a sacrificial layer disposed on said transfer layer opposite to said micro light-emitting diode.

8. The micro light-emitting component according to claim 7, further comprising a support member which is disposed on said sacrificial layer opposite to said transfer layer, and which is selected from the group consisting of a light-transmissive support and an opaque support.

9. The micro light-emitting component according to claim 7, wherein said sacrificial layer is made of a material selected from the group consisting of GaN, AlGaN, InGaN, GaSiN, GaMgN, and combinations thereof.

10. The micro light-emitting component according to claim 1, wherein said micro light-emitting diode is selected from the group consisting of a face-up type light-emitting diode, a flip type light-emitting diode, and a vertical type light-emitting diode.

11. A micro light-emitting component matrix, comprising:
a plurality of micro light-emitting diodes; and
a transfer layer which has a plurality of recesses for receiving said micro light-emitting diodes, respectively, so as to permit said micro light-emitting diodes to be retained by said transfer layer, and which is transformable from a first state, in which said transfer layer is deformed by said micro light-emitting diodes to form said recesses, to a second state, in which said micro light-emitting diodes respectively received in said recesses are retained by said transfer layer,
wherein said transfer layer is made of an opaque material selected from the group consisting of a light-reflective material, a light-absorptive material, and a combination thereof, and
said transfer layer further has a plurality of top openings, each of which is disposed opposite to a corresponding one of said recesses, and each of which is configured to permit light from a corresponding one of said micro light-emitting diodes to transmit therethrough.

12. The micro light-emitting component matrix according to claim 11, wherein said transfer layer deformed by said micro light-emitting diodes produces retaining forces to permit said micro light-emitting diodes to be retained by said transfer layer.

13. The micro light-emitting component matrix according to claim 11, wherein said transfer layer is made of a material selected from the group consisting of a benzocyclobutene adhesive, a silicone, an epoxy resin, an ultraviolet curing adhesive, and combinations thereof.

14. The micro light-emitting component matrix according to claim 11, wherein each of said recesses forms an opening that converges inwardly.

15. The micro light-emitting component matrix according to claim 11, wherein each of said recesses has a depth ranging from 0.1 μm to 5.0 μm.

16. The micro light-emitting component matrix according to claim 11, wherein each of said recesses has a depth ranging from 0.5 μm to 1.5 μm.

17. The micro light-emitting component matrix according to claim 11, further comprising a sacrificial layer disposed on said transfer layer opposite to said micro light-emitting diodes.

18. The micro light-emitting component matrix according to claim 17, further comprising a support member which is disposed on said sacrificial layer opposite to said transfer layer, and which is selected from the group consisting of a light-transmissive support and an opaque support.

19. The micro light-emitting component matrix according to claim 17, wherein said sacrificial layer is made of a light-transmissive material.

20. The micro light-emitting component matrix according to claim 17, wherein said sacrificial layer is made of a material selected from the group consisting of GaN, AlGaN, InGaN, GaSiN, GaMgN, and combinations thereof.

21. The micro light-emitting component matrix according to claim 11, wherein said micro light-emitting diodes are independently selected from the group consisting of a face-up type light-emitting diode, a flip type light-emitting diode, and a vertical type light-emitting diode.

22. The micro light-emitting component matrix according to claim 11, further comprising a bonding substrate bonding to said micro light-emitting diodes opposite to said transfer layer.

23. The micro light-emitting component matrix according to claim 11, wherein said micro light-emitting diodes are independently selected from the group consisting of a red light-emitting diode, a blue light-emitting diode, and a green light-emitting diode.

24. A micro light-emitting component matrix, comprising:
a plurality of micro light-emitting diodes;
a transfer layer which has a plurality of recesses for receiving said micro light-emitting diodes, respectively, so as to permit said micro light-emitting diodes to be retained by said transfer layer, and which is transformable from a first state, in which said transfer layer is deformed by said micro light-emitting diodes to form said recesses, to a second state, in which said micro light-emitting diodes respectively received in said recesses are retained by said transfer layer; and
a light-blocking layer which includes a plurality of light-blocking portions disposed on said transfer layer opposite to said micro light-emitting diodes, each of said light-blocking portions being aligned with a gap between two adjacent ones of said micro light-emitting diodes.

25. The micro light-emitting component matrix according to claim 24, wherein said light-blocking layer is made of a material selected from the group consisting of a light-reflective material, a light-absorptive material, and a combination thereof.

26. The micro light-emitting component matrix according to claim 24, wherein said light-blocking layer is made of a material selected from the group consisting of a metal material, a non-metal material, and a combination thereof.

27. A micro light-emitting component matrix, comprising:
a plurality of micro light-emitting diodes;
a transfer layer which has a plurality of recesses for receiving said micro light-emitting diodes, respectively, so as to permit said micro light-emitting diodes to be retained by said transfer layer, and which is transformable from a first state, in which said transfer layer is deformed by said micro light-emitting diodes to form said recesses, to a second state, in which said micro light-emitting diodes respectively received in said recesses are retained by said transfer layer; and
a light-blocking layer which includes a plurality of light-blocking portions inserted in said transfer layer opposite to said micro light-emitting diodes, each of said light-blocking portions being aligned with a gap between two adjacent ones of said micro light-emitting diodes.

28. A micro light-emitting component, comprising:
a micro light-emitting diode;
a transfer layer which has a recess for receiving said micro light-emitting diode so as to permit said micro light-emitting diode to be retained by said transfer layer, and which is transformable from a first state, in which said transfer layer is deformed by said micro light-emitting diode to form said recess, to a second state, in which said micro light-emitting diode received in said recess is retained by said transfer layer; and
a light-blocking layer which includes a light-blocking portion disposed on said transfer layer opposite to said micro light-emitting diode and misaligned with said micro light-emitting diode in a direction perpendicular to said transfer layer.

29. A micro light-emitting component, comprising:
a micro light-emitting diode;
a transfer layer which has a recess for receiving said micro light-emitting diode so as to permit said micro light-emitting diode to be retained by said transfer layer, and which is transformable from a first state, in which said transfer layer is deformed by said micro light-emitting diode to form said recess, to a second state, in which said micro light-emitting diode received in said recess is retained by said transfer layer; and a light-blocking layer which includes a light-blocking portion inserted in said transfer layer opposite to said micro light-emitting diodes and misaligned with said micro light-emitting diode in a direction perpendicular to said transfer layer.

* * * * *